United States Patent
Lee et al.

(10) Patent No.: US 9,147,723 B1
(45) Date of Patent: Sep. 29, 2015

(54) ORGANIC LIGHT EMITTING DISPLAY DEVICE AND METHOD OF REPAIRING THE SAME

(71) Applicant: LG Display Co., Ltd., Seoul (KR)

(72) Inventors: HyunHaeng Lee, Gyeongsangbuk-do (KR); SooHong Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/549,734

(22) Filed: Nov. 21, 2014

(30) Foreign Application Priority Data

Aug. 21, 2014 (KR) .......................... 10-2014-0108982

(51) Int. Cl.
| | |
|---|---|
| H01L 33/16 | (2010.01) |
| H01L 27/32 | (2006.01) |
| G02F 1/1333 | (2006.01) |
| G02F 1/136 | (2006.01) |
| H01L 51/56 | (2006.01) |
| G09G 3/32 | (2006.01) |

(52) U.S. Cl.
CPC .......... *H01L 27/3276* (2013.01); *G02F 1/1333* (2013.01); *G09G 3/3241* (2013.01); *H01L 27/322* (2013.01); *H01L 51/56* (2013.01); *H01L 2227/323* (2013.01); *H01L 2251/568* (2013.01)

(58) Field of Classification Search
CPC  G02F 1/1333; G09G 3/3241; H01L 27/3276; H01L 27/322; H01L 2227/323; H01L 51/56; H01L 2251/586
USPC ........... 349/43, 54, 55, 114; 345/690; 257/40, 257/59, 71, 72, E21.347, E21.616, 257/E27.111, E29.291, E33.004, E33.053; 438/4, 22, 34
See application file for complete search history.

(56) References Cited

U.S. PATENT DOCUMENTS

| | | | | |
|---|---|---|---|---|
| 5,303,074 | A  * | 4/1994  | Salisbury | 349/55 |
| 7,119,872 | B2 * | 10/2006 | Choi | 349/192 |
| 2001/0028418 | A1 * | 10/2001 | Ozaki et al. | 349/54 |
| 2002/0054037 | A1 * | 5/2002  | Kawano et al. | 345/205 |
| 2007/0126460 | A1   | 6/2007  | Chung et al. | |
| 2008/0036936 | A1 * | 2/2008  | Kawamura et al. | 349/54 |
| 2010/0155734 | A1 * | 6/2010  | Lee et al. | 257/59 |
| 2011/0304790 | A1 * | 12/2011 | Cho | 349/43 |
| 2012/0038601 | A1   | 2/2012  | Huang | |
| 2013/0329158 | A1 * | 12/2013 | Kanamori | 349/43 |
| 2014/0022289 | A1   | 1/2014  | Lee et al. | |
| 2014/0292827 | A1 * | 10/2014 | Kang et al. | 345/690 |
| 2014/0346475 | A1 * | 11/2014 | Cho et al. | 257/40 |

OTHER PUBLICATIONS

Search Report dated May 13, 2015, issued by the European Patent Office in European Patent Application No. 14198459.1.

* cited by examiner

*Primary Examiner* — Dao H Nguyen
(74) *Attorney, Agent, or Firm* — Morgan, Lewis & Bockius LLP

(57) ABSTRACT

Provided are an organic light emitting display (OLED) device and a method of repairing the same. The OLED device includes: a first pixel including: a first thin-film transistor (TFT) including a source electrode, a second TFT, and a third TFT including a top gate electrode, a second pixel including an OLED including a first electrode, a repair line extending over: the first electrode of the OLED of the second pixel, the source electrode of the first TFT of the first pixel, and the top gate electrode of the third TFT of the first pixel, an insulating layer between at least a portion of: the top gate electrode of the third TFT of the first pixel, and the repair line.

20 Claims, 6 Drawing Sheets

ORGANIC LIGHT EMITTING DISPLAY DEVICE AND METHOD OF REPAIRING THE SAME

CROSS-REFERENCE TO RELATED APPLICATION(S)

The present application claims benefit and priority under 35 U.S.C. §119(a) of Korean Patent Application No. 10-2014-0108982, filed on Aug. 21, 2014, the entire disclosure of which is hereby incorporated by reference herein for all purposes.

BACKGROUND

1. Technical Field

The following description relates to an organic light emitting display device and method of repairing the same, and more particularly, to an organic light emitting display device in which a defective pixel can be repaired.

2. Discussion of the Related Art

Organic light emitting display devices are devices that have a structure in which an emission layer is formed between a cathode, through which an electron is injected, and an anode through which a positive hole is injected, and use the principle in which, when the electron generated from the cathode and the positive hole generated from the anode are injected into the emission layer, the injected electron and positive hole are combined to generate an exciton, and the exciton is shifted from an excited state to a ground state to emit light.

Hereinafter, a related art organic light emitting display device will be described with reference to the drawings.

FIG. 1 is a circuit diagram of a pixel configuring a related art organic light emitting display device.

As seen in FIG. 1, the pixel configuring the related art organic light emitting display device includes a gate line GL, a data line DL, a high power line VDD, a reference line Ref, a switching thin film transistor (TFT) T1, a driving TFT T2, a sensing TFT T3, a capacitor C, and an organic light emitting diode OLED.

The switching TFT T1 is turned on according to a gate signal supplied through the gate line GL, and supplies a data voltage, supplied from the data line DL, to the driving TFT T2.

The driving TFT T2 is turned on with the data voltage supplied from the switching TFT T1, and generates a data current from power supplied from the high power line VDD to supply the data current to the organic light emitting diode OLED.

The sensing TFT T3 is for sensing a threshold voltage deviation of the driving TFT T2 that causes a degradation in a quality of an image, and sensing of the threshold voltage deviation is performed in a sensing mode. The sensing TFT T3 supplies a current of the driving TFT T2 to the reference line Ref in response to a sensing control signal supplied through the gate line GL.

The capacitor C holds the data voltage supplied to the driving TFT T2 during one frame, and is connected to a gate electrode and a source electrode of the driving TFT T2.

The organic light emitting diode OLED emits light with the data current supplied from the driving TFT T2. A cathode of the organic light emitting diode OLED is connected to a low power line VSS.

In the pixel of the related art organic light emitting display device, an error can occur due to various causes. For example, a dark spot error can occur when a line or an electrode is disconnected, such that black is always displayed because a pixel is not driven; and a hot spot error can occur when a line or an electrode is short-circuited, such that white is always displayed.

Because a quality of a displayed image is degraded due to the dark spot error or the hot spot error, a method of repairing a defect of a pixel is needed.

SUMMARY

Accordingly, embodiments of the present application are directed to an organic light emitting display device and method of repairing the same that substantially obviate one or more problems due to the limitations and disadvantages of the related art.

An object of embodiments is to provide an organic light emitting display device in which a defective pixel can be repaired.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose according to one aspect of the invention, there is provided an organic light emitting display (OLED) device, including: a first pixel including: a first thin-film transistor (TFT) including a source electrode, a second TFT, and a third TFT including a top gate electrode, a second pixel including an OLED including a first electrode, a repair line extending over: the first electrode of the OLED of the second pixel, the source electrode of the first TFT of the first pixel, and the top gate electrode of the third TFT of the first pixel, an insulating layer between at least a portion of: the top gate electrode of the third TFT of the first pixel, and the repair line.

In another aspect, there is provided a method of repairing an organic light emitting display (OLED) device including a first pixel including: a first thin-film transistor (TFT) including a source electrode, a second TFT, and a third TFT including a top gate electrode, a second pixel including an OLED including a first electrode, a repair line extending over: the first electrode of the OLED of the second pixel, the source electrode of the first TFT of the first pixel, and the top gate electrode of the third TFT of the first pixel, an insulating layer between at least a portion of: the top gate electrode of the third TFT of the first pixel, and the repair line, the method including: if the second pixel is defective, forming a hole in the passivation layer, such that the repair line is directly physically connected to the source electrode of the first driving TFT of the first pixel through the hole, wherein the hole is formed by irradiating a laser beam through the insulating layer.

In another aspect, there is provided a method of manufacturing an organic light emitting display (OLED) device, the method including: providing a first pixel including: providing a first thin-film transistor (TFT) including a source electrode, providing a second TFT, and providing a third TFT including a top gate electrode, providing a second pixel including: an OLED including a first electrode, and a color filter layer, providing a repair line extending over: the first electrode of the OLED of the second pixel, the source electrode of the first TFT of the first pixel, and the top gate electrode of the third TFT of the first pixel, providing an insulating layer between at least a portion of: the top gate electrode of the third TFT of the first pixel, and the repair line, the insulating layer and the color filter layer being formed in a same mask operation.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are examples and explanatory and are intended to provide further explanation of the disclosure as claimed.

BRIEF DESCRIPTION OF THE DRAWINGS

The accompanying drawings, which are included to provide a further understanding of the invention and are incorporated in and constitute a part of this specification, illustrate implementations of the invention and together with the description serve to explain the principles of the invention.

Figure 1:
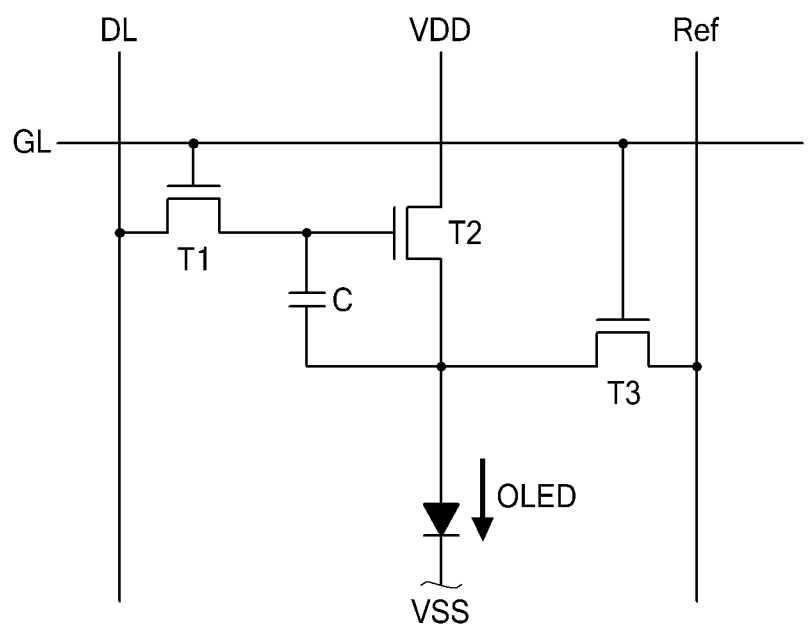
FIG. 1 is a circuit diagram of a pixel configuring a related art organic light emitting display device.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present invention, examples of which are illustrated in the accompanying drawings. In the following description, when a detailed description of well-known functions or configurations related to this document is determined to unnecessarily cloud a gist of the invention, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

Hereinafter, embodiments will be described in detail with reference to the accompanying drawings.

Figure 2:
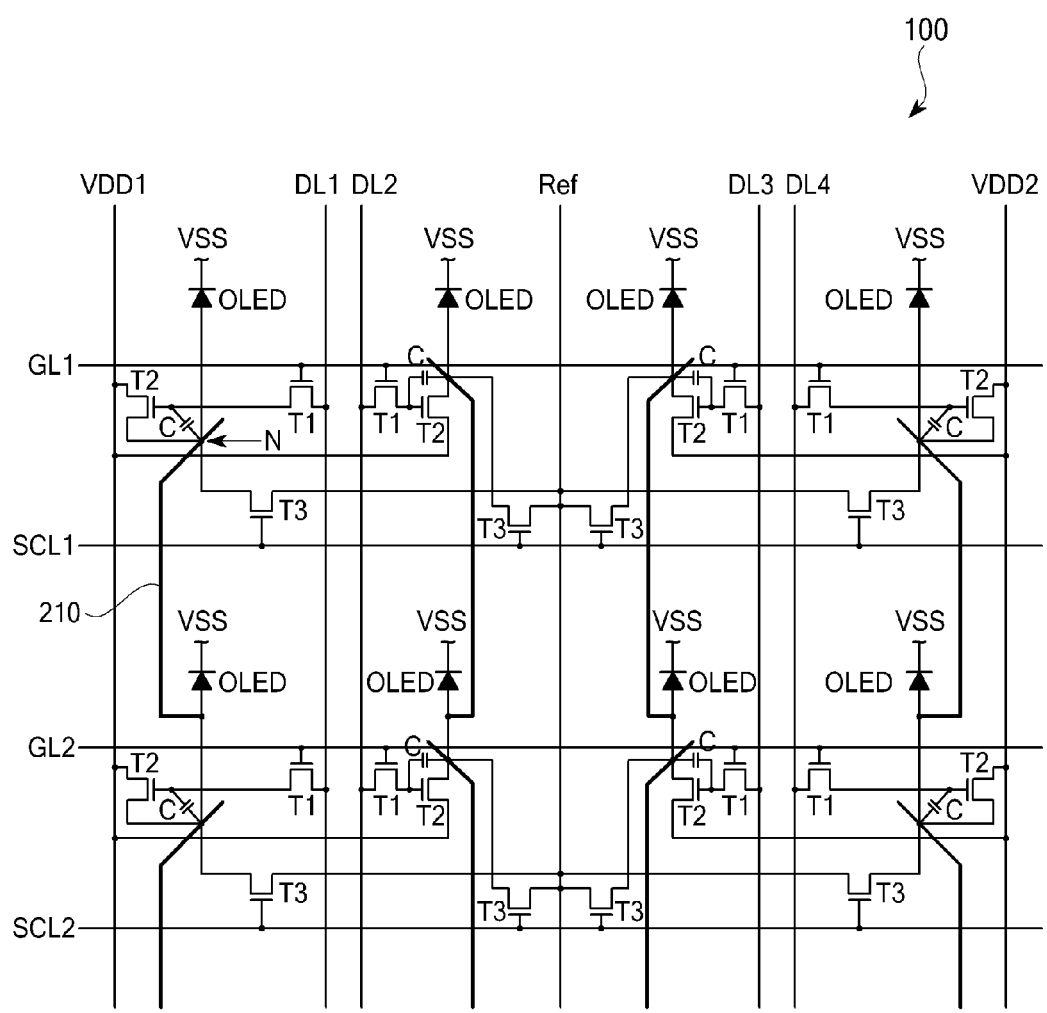
FIG. 2 is a circuit diagram of an organic light emitting display device according to an embodiment.

FIG. 2 is a circuit diagram of an organic light emitting display device according to an embodiment. FIG. 2 illustrates a unit pixel that may include four pixels respectively arranged on first to fourth columns, which may be provided on each of a first row and a second row. A pixel of the first row may be disposed over a pixel of the second row with respect to a first sensing control line SCL1.

As seen in the FIG. 2 example, an organic light emitting display device according to an embodiment may include a substrate 100, first and second gate lines GL1 and GL2, first and second sensing control lines SCL1 and SCL2, first to fourth data lines DL1 to DL4, first and second high power lines VDD1 and VDD2, a reference line Ref, a switching TFT T1, a driving TFT T2, a sensing TFT T3, a capacitor C, an organic light emitting diode OLED, and a repair line 210.

A pixel of a first column may be formed between the first high power line VDD1 and the first data line DL1, a pixel of a second column may be formed between the second data line DL2 and the reference line Ref, a pixel of a third column may be formed between the reference line Ref and the third data line DL3, and a pixel of the fourth column may be formed between the fourth data line DL4 and the second high power line VDD2. Also, a plurality of pixels respectively arranged on the first to fourth columns may include a pixel of a first row that may include the first gate line GL1, the first sensing control line SCL1, and the organic light emitting diode OLED; and a pixel of a second row that may include the second gate line GL2, the second sensing control line SCL2, and the organic light emitting diode OLED. According to an embodiment, as described above, four pixels respectively arranged on the first to fourth columns may be provided by using two the high power lines VDD1 and VDD2 and the reference line Ref, and thus, the total number of lines may be reduced. That is, because one power line, one reference line, one data line, one gate line, and one sensing control line are generally used to form one pixel of the related art, each of the lines is used four times by the related art for forming four pixels. However, according to an embodiment, two power lines, one reference line, four data lines, four gate lines, and four sensing control lines are used to form four pixels, and thus, the total number of power lines and the total number of reference lines are reduced.

The switching TFT T1, the driving TFT T2, the sensing TFT T3, the capacitor C, and the organic light emitting diode OLED may be included in each of the plurality of pixels. The unit pixel may include four pixels, which may include a pixel emitting red (R) light, a pixel emitting white (W) light, a pixel emitting blue (B) light, and a pixel emitting green (G) light, but embodiments are not limited thereto. An example configuration of each of the pixels will now be described in detail.

The substrate 100 may be formed of glass or transparent plastic, but embodiments are not limited thereto. The first gate line GL1 and the second gate line GL2 may be arranged in a first direction (for example, a width or horizontal direction) on the substrate 100. The first gate line GL1 and the second gate line GL2 may be connected to the switching TFT T1 included in each pixel.

The first sensing control line SCL1 and the second sensing control line SCL2 may be arranged in the first direction (for example, the width or horizontal direction) on the substrate 100. The first sensing control line SCL1 may be arranged between the first gate line GL1 and the second gate line GL2.

The second sensing control line SCL2 may be arranged between the second gate line GL2 and a third gate line (not shown). The first sensing control line SCL1 and the second sensing control line SCL2 may be connected to the sensing TFT T3 included in each pixel.

The first data line DL1, the second data line DL2, the third data line DL3, and the fourth data line DL4 may be arranged in a second direction (for example, a height or vertical direction) on the substrate 100. The first data line DL1 and the second data line DL2 may be arranged adjacent to each other, and thus, another line may not be formed therebetween in the second direction. The third data line DL3 and the fourth data line DL4 may be arranged adjacent to each other, and thus, another line may not be formed therebetween in the second direction.

The first data line DL1, the second data line DL2, the third data line DL3, and the fourth data line DL4 may be connected to the switching TFT T1 included in each pixel.

The first high power line VDD1 and the second high power line VDD2 may be arranged in the second direction (for example, the height or vertical direction) on the substrate 100. The first to fourth data lines DL 1 to DL4 and the reference line Ref may be arranged between the first high power line VDD1 and the second high power line VDD2. Although not shown, data lines of adjacent pixels may be respectively arranged at the left of the first high power line VDD1 and the right of the second high power line VDD2.

The first high power line VDD1 may be connected to the driving TFT T2 included in each of the pixel of the first column and the pixel of the second column. The first high power line VDD1 may be disposed adjacent to the pixel of the first column, and thus may be easily connected to the driving TFT T2 included in the pixel of the first column. However, because the first high power line VDD1 may not be disposed adjacent to the pixel of the second column, it may be difficult to connect the first high power line VDD1 to the driving TFT T2 included in the pixel of the second column, and for at least this reason, the first high power line VDD1 may be connected to the driving TFT T2 (included in the pixel of the second column) through a separate power connection line.

The second high power line VDD2 may be connected to the driving TFT T2 included in each of the pixel of the third column and the pixel of the fourth column. The second high power line VDD2 may be disposed adjacent to the pixel of the fourth column, and thus may be easily connected to the driving TFT T2 included in the pixel of the fourth column. However, because the second high power line VDD2 may not be disposed adjacent to the pixel of the third column, it may be difficult to connect the second high power line VDD2 to the driving TFT T2 included in the pixel of the third column, and for at least this reason, the second high power line VDD2 may be connected to the driving TFT T2 (included in the pixel of the third column) through a separate power connection line.

The reference line Ref may be arranged in the second direction (for example, the height or vertical direction) on the substrate 100. The reference line Ref may be arranged between the second data line DL2 and the third data line DL3. The reference line Ref may be connected to the sensing TFT T3 included in each of the pixels of the first to fourth columns. The reference line Ref may be disposed adjacent to the pixel of the second column and the pixel of the third column, and thus may be easily connected to the sensing TFT T3 included in each of the pixel of the second column and the pixel of the third column. However, because the reference line Ref may not be disposed adjacent to the pixel of the first column and the pixel of the fourth pixel, it may be difficult to connect the reference line Ref to the sensing TFT T3 included in the pixel of the first column and in the pixel of the fourth pixel. For at least this reason, the reference line Ref may be connected to the sensing TFT T3 (included in the pixel of the first column and in the pixel of the fourth pixel) through a separate reference connection line.

The switching TFT T1 may be turned on according to a gate signal supplied through the gate lines GL1 to GL2, and may supply a data voltage (supplied from a corresponding data line among the data lines DL1 to DL4) to the driving TFT T2. The driving TFT T2 may be turned on with the data voltage supplied from the switching TFT T1, and may generate a data current from power supplied from the appropriate high power line VDD1 or VDD2 to supply the data current to the organic light emitting diode OLED.

The sensing TFT T3 may sense a threshold voltage deviation of the driving TFT T2 which may cause a degradation in a quality of an image, and sensing of the threshold voltage deviation may be performed in a sensing mode. The sensing TFT T3 may supply a current of the driving TFT T2 to the reference line Ref in response to a sensing control signal supplied through the appropriate sensing control line SCL1 or SCL2. The capacitor C may hold the data voltage supplied to the driving TFT T2 during one frame, and may be connected to a gate electrode of the driving TFT T2 at one end and to a node N that is also connected to a source electrode of the driving TFT T2.

The organic light emitting diode OLED may emit light with the data current supplied from the driving TFT T2. The organic light emitting diode OLED may include a first electrode, an emission layer, and a second electrode. The first electrode may be connected to the source electrode of the driving TFT T2, and the second electrode may be connected to a low power line VSS. The first electrode may act as an anode, and the second electrode may act as a cathode.

The repair line 210 may extend from the organic light emitting diode OLED (included in the pixel of the second row) to the driving TFT T2 included in the pixel of the first row. For example, one end of the repair line 210 may be connected to the first electrode of the organic light emitting diode OLED included in the pixel of the second row, and the other end of the repair line 210 may extend to the source electrode of the driving TFT T2 included in the pixel of the first row. That is, the other end of the repair line 210 may overlap the source electrode of the driving TFT T2, and a passivation layer of an inorganic insulator may be formed between the other end of the repair line 210 and the source electrode of the driving TFT T2.

Therefore, for example, when it is determined that the pixel of the first row is defective, the passivation layer between the other end of the repair line 210 and the source electrode of the driving TFT T2 may be broken by a laser beam, and thus, the other end of the repair line 210 may be electronically connected to the source electrode of the driving TFT T2. Therefore, the first electrode of the organic light emitting diode OLED (included in the pixel of the second row) may be electrically connected to the source electrode of the driving TFT T2 (included in the pixel of the first row) through repair line 210. Thus, when the pixel of the second row is driven, the pixel of the first row may be driven along with the pixel of the second row. That is, when a current flows in the first electrode of the organic light emitting diode OLED included in the pixel of the second row, the current may also flow in the first electrode of the organic light emitting diode OLED connected to the source electrode of the driving TFT T2 of the first row, and thus, the organic light emitting diode OLED included in the pixel of the second row and the organic light emitting diode OLED included in the pixel of the first row may be simultaneously driven. Accordingly, because the defective pixel of the first row may be driven simultaneously with the pixel of the second row, a dark spot error or a hot spot error may not occur in the pixel of the first row.

However, embodiments are not limited to details illustrated in the example of FIG. 2. For example, the one end of the repair line 210 may be connected to the first electrode of the organic light emitting diode OLED included in the pixel of the first row, and the other end of the repair line 210 may extend to on the source electrode of the driving TFT T2 included in the pixel of the second row. Therefore, when the pixel of the second row is defective, the pixel of the second row may be driven simultaneously with the pixel of the first row.

Figure 3:
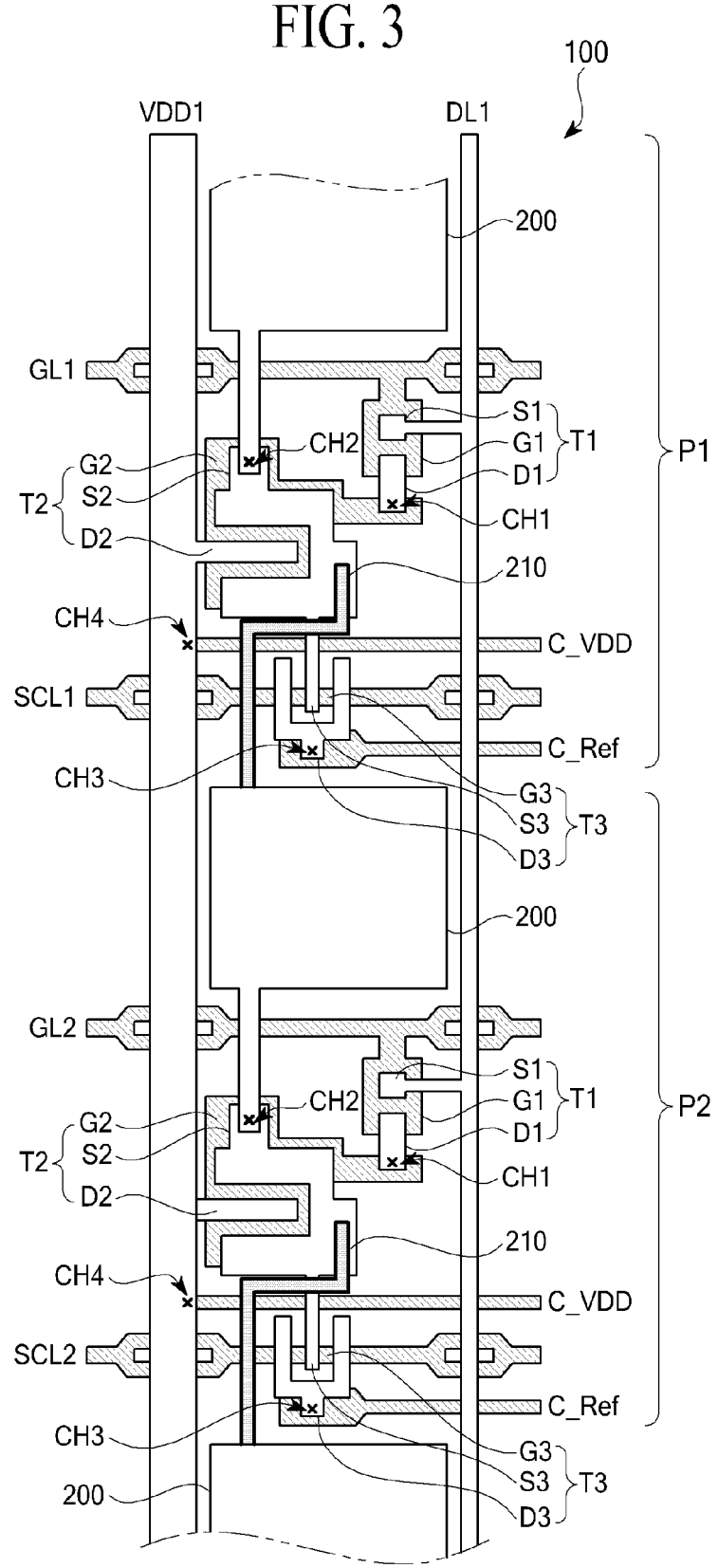
FIG. 3 is a plan view illustrating two pixels according to an embodiment.

FIG. 3 is a plan view illustrating two pixels according to an embodiment. FIG. 3 illustrates an example of a first pixel P1 arranged on first row, first column of FIG. 2 and a second pixel P2 arranged on second row, first column of FIG. 2.

As seen in the example of FIG. 3, the first gate GL1, the first sensing control line SCL1, the second gate line GL2, and the second sensing control line SCL2 may be formed in the first direction; and the first high power line VDD1 and the first data line DL1 may be formed in the second direction intersecting the first direction.

In each of the first gate GL1, the first sensing control line SCL1, the second gate line GL2, and the second sensing control line SCL2, a hole may be formed in an area intersecting the first high power line VDD1 and the first data line DL1. The hole may decrease an overlapping area in the intersecting area, and thus may reduce signal interference therebetween.

The switching TFT T1, the driving TFT T2, the sensing TFT T3, and a first electrode 200 of the organic light emitting diode OLED may be formed in the first pixel P1.

The switching TFT T1 formed in the first pixel P1 may include a first gate electrode G, a first source electrode S1, and a first drain electrode D1. The switching TFT T1 may further include a top gate electrode, and thus may have a double gate structure. This structure will be described below as an example.

The first gate electrode G1 may be formed in a structure which may be branched from the first gate line GL1, but embodiments are not limited thereto. For example, a portion of the first gate line GL1 may act as the first gate electrode G1. The first source electrode S1 may be formed in a structure which may be branched from the first data line DL1. The first drain electrode D1 may face the first source electrode S1. The first drain electrode D1 may be connected to a second gate electrode G2 of the driving TFT T2 through a first contact hole CH1. Although not shown in the FIG. 3 example, an active layer (e.g., active layer 120 in the FIG. 5 example) may be further formed in the switching TFT T1. The active layer may be connected to the first source electrode S1 and the first drain electrode D1, and may function as an electron-moving channel.

The driving TFT T2 formed in the first pixel P1 may include a second gate electrode G2, a second source electrode S2, and a second drain electrode D2. The driving TFT T2 may further include a top gate electrode, and thus may have a double gate structure. This structure will be described below as an example.

The second gate electrode G2, as described above, may be connected to the first drain electrode D1 of the switching TFT T1 through the contact hole CH1. The second drain electrode D2 may be formed in a structure which may be branched from the first high power line VDD1. The second source electrode S2 may face the second drain electrode D2. The second source electrode S2 may function as a third source electrode S3 (described below) of the sensing TFT T3. Also, the second source electrode S2 may be connected to the first electrode 200 of the organic light emitting diode OLED through a second contact hole CH2. Although not shown in the FIG. 3 example, an active layer (e.g., active layer 120 in the FIG. 5 example) may be further formed in the driving TFT T2. The active layer may be connected to the second source electrode S2 and the second drain electrode D2, and may function as the electron-moving channel.

The sensing TFT T3 formed in the first pixel P1 may include a third gate electrode G3, a third source electrode S3, and a third drain electrode D3. The sensing TFT T3 may further include a top gate electrode, and thus may have a double gate structure. This structure will be described below as an example.

The third gate electrode G3 may be a portion of the first sensing control line SCL1, but embodiments are not limited thereto. The first sensing control line SCL1 may have a branch structure to be the third gate electrode G3. The third source electrode S3, as described above, may be the same structure as the second source electrode S2 of the driving TFT T2, e.g., the third source electrode S3 may be a branch of S2. The third drain electrode D3 may face the third source electrode S3, and may be connected to a reference connection line C_Ref through a third contact hole CH3. The reference connection line C_Ref may be arranged in the first direction, and may be connected to a reference line (e.g., Ref of the FIG. 2 example). Therefore, the third drain electrode D3 may be connected to the reference line (e.g., Ref of the FIG. 2 example) via the reference connection line C_Ref. Although not shown in the FIG. 3 example, an active layer (e.g., active layer 120 in the FIG. 5 example) may be further formed in the sensing TFT T3. The active layer may be connected to the third source electrode S3 and the third drain electrode D3, and may function as the electron-moving channel. The first electrode 200 of the organic light emitting diode OLED, as described above, may be connected to the second source electrode S2 of the driving TFT T2 through the contact hole CH2.

A power connection line C_VDD may connect the first high power line VDD1 to a drain electrode of a driving TFT of an adjacent pixel. Therefore, one end of the power connection line C_VDD may be connected to the first high power line VDD1 through a fourth contact hole CH4, and the other end of the power connection line C_VDD may be connected to a drain electrode of a driving TFT of an adjacent pixel through a separate contact hole.

A switching TFT T1, a driving TFT T2, a sensing TFT T3, and a first electrode 200 of an organic light emitting diode OLED may be formed in the second pixel P2. Configurations of the elements substantially similar to those of the above-described first pixel P1, and thus, their descriptions are not repeated.

A repair line 210 may be connected to the first electrode 200 of the organic light emitting diode OLED formed in the second pixel P2. The repair line 210 may be formed as one body with the first electrode 200 of the second pixel P2. That is, the repair line 210 may be formed of the same material as that of the first electrode 200 of the second pixel P2 and on the same layer. In this case, a separate process of forming the repair line 210 may not be additionally performed. It should be understood that embodiments are not limited to this structure and process. For example, the repair line 210 may be formed having a different material and/or being formed in a separate process.

The repair line 210 may intersect the first sensing control line SCL1, and may extend to the driving TFT T2 of the first pixel P1. For example, the repair line 210 may overlap the source electrode S2 of the driving TFT T2 included in the first pixel P1. Therefore, as described above, when it is determined that the first pixel P1 is defective, the repair line 210 may be electrically connected to the source electrode S2 of the driving TFT T2 included in the first pixel P1. As such, the first electrode 200 of the organic light emitting diode OLED included in the second pixel P2 may be electrically connected to the source electrode S2 of the driving TFT T2 included in the first pixel P1.

Therefore, when the second pixel P2 is driven, the first pixel P1 may be driven along with the second pixel P2 because the driving TFT T2 will be active due to its source electrode S2 being bypassed. In other words, when there is a defect in the first pixel P1, the voltage applied to the organic light emitting diode OLED of the second pixel P2 will also be applied directly to the organic light emitting diode OLED of the first pixel P1. Therefore, defects in any of the TFTs T1, T2, T3, or of any part other than the organic light emitting diode OLED itself can be bypassed.

Figure 4:
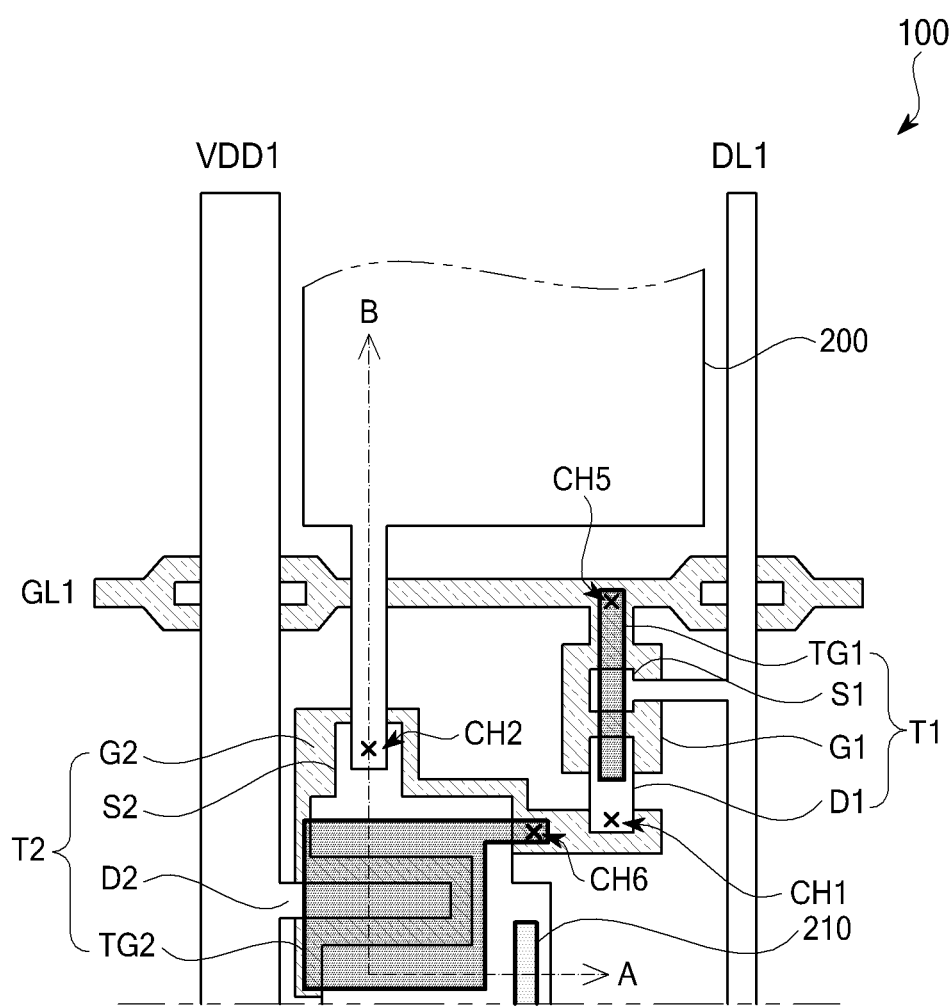
FIG. 4 is a plan view illustrating a switching TFT area and a driving TFT area according to an embodiment.

FIG. 4 is a plan view illustrating a switching TFT area and a driving TFT area according to an embodiment. FIG. 4 illustrates an example structure in which the switching TFT and driving TFT of the above-described pixels P1, P2 of FIG. 3 are formed in the double gate structure. Therefore, like reference numerals refer to like elements, and hereinafter, different elements will be described.

As seen in the FIG. 4 example, a switching TFT T1 may include the first gate electrode G1, the first source electrode S1, the first drain electrode D1, and a first top gate electrode TG1. The first top gate electrode TG1 may be connected to the first gate line GL1 through a fifth contact hole CH5. Therefore, a gate signal supplied through the first gate line GL1 may be simultaneously applied to the first gate electrode G1 (functioning as a bottom gate) and to the first top gate electrode TG1 (functioning as a top gate). Thus, a response time of the switching TFT T1 may be enhanced.

Moreover, a driving TFT T2 may include the second gate electrode G2, the second source electrode S2, the second drain electrode D2, and a second top gate electrode TG2. The second top gate electrode TG2 may be connected to the second gate line GL2 through a sixth contact hole CH6. Therefore, the gate signal supplied through the first drain electrode D1 of the switching TFT T1 may be simultaneously applied to the second gate electrode G2 (functioning as a bottom gate) and to the second top gate electrode TG2 (functioing as a top gate). Thus, a response time of the driving TFT T2 may be enhanced.

Figure 5:
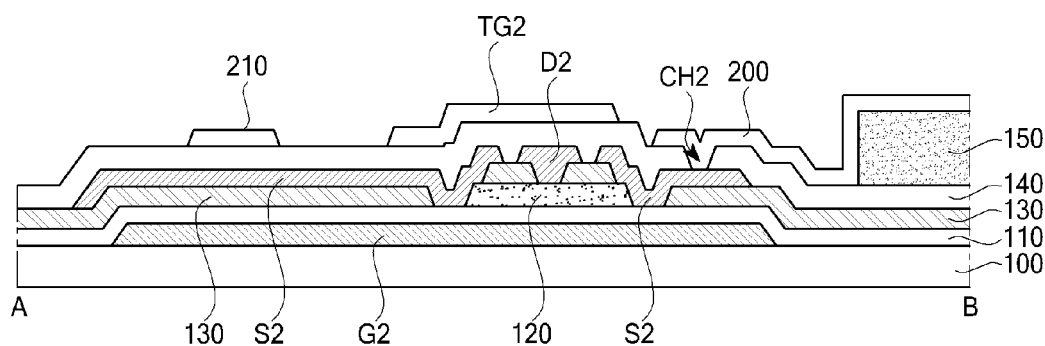
FIG. 5 is a cross-sectional view taken along line A-B of FIG. 4.

FIG. 5 is a cross-sectional view taken along line A-B of FIG. 4. Hereinafter, a cross-sectional structure of a driving TFT T2 area and an organic light emitting diode OLED area according to an embodiment will be described.

As seen in the FIG. 5 example, the second gate electrode G2 may be formed on the substrate 100, and a gate insulating layer 110 may be formed on the second gate electrode G2. An active layer 120 may be formed on the gate insulating layer 110, and an etch stopper layer 130 may be formed on the active layer 120.

The second source electrode S2 and the second drain electrode D2 may be formed on the etch stopper layer 130. The second source electrode S2 and the second drain electrode D2 may be connected to the active layer 120 through a contact hole included in the etch stopper layer 130. The etch stopper layer 130 may be omitted. A passivation layer 140 may be formed on the second source electrode S2 and the second drain electrode D2.

The second top gate electrode TG2, the first electrode 200 of an organic light emitting diode OLED, and the repair line 210 may be formed on the passivation layer 140. The second top gate electrode TG2, the first electrode 200 of the organic light emitting diode OLED, and the repair line 210 may be separated from each other by a predetermined distance to prevent a short circuit from occurring therebetween.

The first electrode 200 of the organic light emitting diode OLED and the repair line 210 may be formed of the same material (although embodiments are not limited thereto). For example, the first electrode 200 of the organic light emitting diode OLED and the repair line 210 may be formed of a transparent conductive material such as indium tin oxide (ITO). Also, the second top gate electrode TG2 may be formed of a material which differs from that of the first electrode 200 and the repair line 210 (although embodiments are not limited thereto). For example, the second top gate electrode TG2 may be formed of opaque metal having good electric conductivity.

The first electrode 200 may be connected to the second source electrode S2 through the second contact hole CH2 included in the passivation layer 140. Although not shown, an organic emission layer emitting light of a predetermined wavelength may be formed on the first electrode 200, and a second electrode may be formed on the organic emission layer. The organic emission layer may emit white (W) light, in which case a red (R) color filter, a green (G) color filter, and a blue (B) color filter may be additionally included in respective pixels. Therefore, as illustrated, a color filter layer 150 may be further formed in an organic light emitting diode OLED area, for example, under the first electrode 200. In one example, the color filter layer 150 may be formed in the organic light emitting diode OLED area that emits light, and may not be formed in the driving TFT T2 area. That is, the color filter layer 150 may not overlap the second top gate electrode TG2 and second source electrode S2 of the driving TFT T2.

The repair line 210 may be formed to overlap the second source electrode S2 with the passivation layer 140 therebetween. That is, a bottom of the repair line 210 and a top of the second source electrode S2 may be formed to contact the passivation layer 140 formed, e.g., of an inorganic insulator. Therefore, the passivation layer 140 may be broken by irradiating a laser beam. Thus, the repair line 210 may be electrically connected to the second source electrode S2.

In a related art organic light emitting display device, a planarizing layer formed of an organic material is additionally formed between the passivation layer 140 and the first electrode 200 of the organic light emitting diode OLED. That is, in the related art, the planarizing layer formed of an organic material is formed on the passivation layer 140 formed of an inorganic material. However, when the planarizing layer is additionally formed on the passivation layer, e.g., the passivation layer 140, it is difficult to electrically connect the repair line 210 to the second source electrode S2 by irradiating a laser beam. Therefore, in an embodiment, the planarizing layer may not be formed on the passivation layer 140, and thus, it may be easier to electrically connect the repair line 210 to the second source electrode S2.

Figure 6:
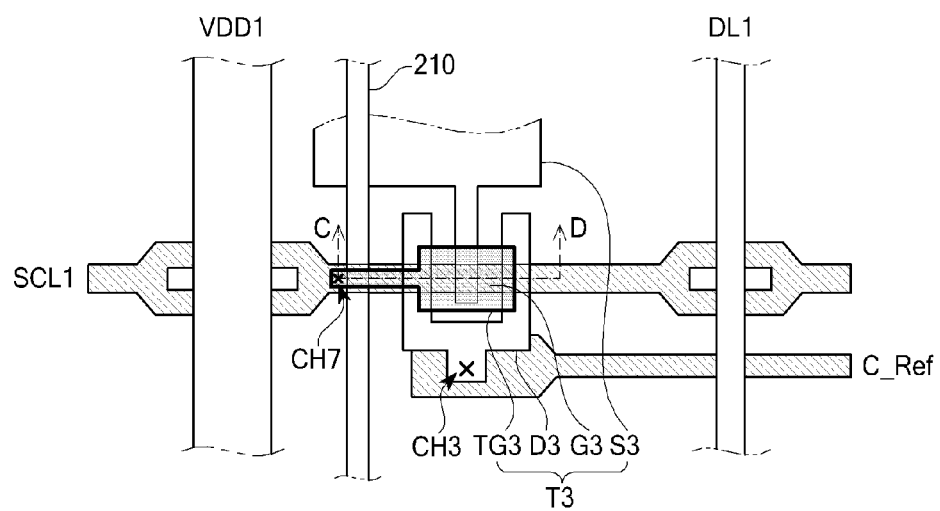
FIG. 6 is a plan view illustrating a sensing TFT area according to an embodiment.

FIG. 6 is a plan view illustrating a sensing TFT area according to an embodiment. FIG. 6 illustrates a structure in which the sensing TFT of the above-described pixel of FIG. 3 is formed in the double gate structure. Therefore, like reference numerals refer to like elements, and hereinafter, different elements will be described.

As seen in the FIG. 6 example, the sensing TFT T3 may include a third gate electrode G3, the third source electrode S3, the third drain electrode D3, and a third top gate electrode TG3. The third top gate electrode TG3 may be connected to the first sensing control line SCL1 through a seventh contact hole CH7. Therefore, a gate signal supplied through the first sensing control line SCL1 may be simultaneously applied to the third gate electrode G3 (functioning as a bottom gate) and to the third top gate electrode TG3 (functioning as a top gate). Thus, a response time of the sensing TFT T3 may be enhanced.

One end of the third top gate electrode TG3 may be connected to the first sensing control line SCL1 through the seventh contact hole CH7, and the other end of the third top gate electrode TG3 may extend to the sensing TFT T3. Therefore, the third top gate electrode TG3 intersects a repair line 210. That is, the third top gate electrode TG3 may overlap the repair line 210 in a predetermined area, and thus may further include an insulating layer for electrically insulating the third top gate electrode TG3 from the repair line 210. This will be described in detail below with reference to FIG. 7 illustrating a detailed cross-sectional structure of the sensing TFT T3.

Figure 7:
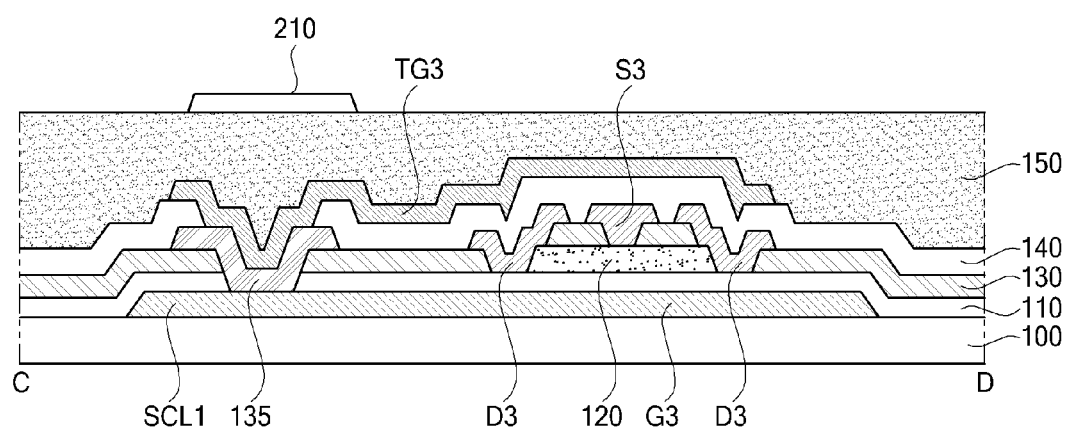
FIG. 7 is a cross-sectional view taken along line C-D of FIG. 6.

FIG. 7 is a cross-sectional view taken along line C-D of FIG. 6. Hereinafter, a cross-sectional structure of a sensing TFT T3 according to an embodiment will be described in detail. Therefore, like reference numerals will refer to like elements, and hereinafter, different elements will be described.

As seen in the FIG. 7 example, the first sensing control line SCL1 may be formed on the substrate 100. A portion of the first sensing control line SCL1, e.g., a portion of the first sensing control line SCL1 overlapping an active layer 120 for the sensing TFT T3, may be the third gate electrode G3 functioning as a bottom gate.

A gate insulating layer 110 for the sensing TFT T3 may be formed on the first sensing control line SCL1, and the active layer 120 may be formed on the gate insulating layer 110. An etch stopper layer 130 for the sensing TFT T3 may be formed on the active layer 120. The etch stopper layer 130 may be omitted.

A connection electrode 135, the third source electrode S3, and the third drain electrode D3 may be formed on the etch stopper layer 130.

The connection electrode 135 may be connected to the first sensing control line SCL1 through a contact hole which is included in the gate insulating layer 110 and the etch stopper layer 130. The connection electrode 135 may be simultaneously formed of the same material as that of the third source electrode S3 and the third drain electrode D3 and on the same layer, although embodiments are not limited thereto. The third source electrode S3 and the third drain electrode D3 may be connected to the active layer 120 through a contact hole included in the etch stopper layer 130.

The passivation layer 140 for the sensing TFT T3 (which may be the same as the passivation layer 140 in the FIG. 5 example) may be formed on the connection electrode 135, the third source electrode S3, and the third drain electrode D3. The third top gate electrode TG3 may be formed on the passivation layer 140.

One end of the third top gate electrode TG3 may be connected to the connection electrode 135 through a contact hole which may be formed in the passivation layer 140, and the other end of the third top gate electrode TG3 may overlap the third gate electrode G3 and the active layer 120. Therefore, the one end of the third top gate electrode TG3 may be connected to the first sensing control line SCL1 through the connection electrode 135. Due to such a structure, the same sensing control signal may be applied to the third gate electrode G3 and the third top gate electrode TG3, thereby forming a double gate structure.

A color filter layer 150 for the sensing TFT T3 (which may be the same as the color filter layer 150 in the FIG. 5 example) may be formed on the third top gate electrode TG3, and the repair line 210 may be formed on the color filter layer 150. The color filter layer 150 may be formed for insulating the third top gate electrode TG3 from the repair line 210. Therefore, the color filter layer 150 may be formed only between the repair line 210 and the third top gate electrode TG3. That is, the color filter layer 150 may be formed in only an area overlapping the repair line 210. However, considering a process margin, as illustrated, the color filter layer 150 may be formed all over the sensing TFT T3 area.

With reference again to FIG. 5, because the repair line 210 and the second top gate electrode TG2 may be respectively formed at separated positions to not overlap in the driving TFT T2 area, the repair line 210 may not be insulated from the second top gate electrode TG2. Thus, the color filter layer 150 may not be formed in the area over the driving TFT T2. In other words, the color filter layer 150 may be omitted from the portion shown in the FIG. 5 example.

On the other hand, because the repair line 210 and the third top gate electrode TG3 may overlap each other in the sensing TFT T3 area, the repair line 210 may be insulated from the third top gate electrode TG3, and thus, the color filter layer 150 may be formed in the sensing TFT T3 area. In other words, the color filter layer 150 may be included from the portion shown in the FIG. 7 example.

The color filter layer 150 formed in the sensing TFT T3 area may include a color filter including the same color as that of the color filter layer 150 formed in the organic light emitting diode OLED area of FIG. 5, but embodiments are not limited thereto.

According to an embodiment, by using the color filter layer 150 (formed in the organic light emitting diode OLED area) as the color filter layer 150 that insulates the third top gate electrode TG3 from the repair line 210, the third top gate electrode TG3 may be insulated from the repair line 210 without separately performing an additional process to provide insulation. However, embodiments are not limited thereto. For example, the third top gate electrode TG3 may be insulated from the repair line 210 by using another insulator.

In an embodiment, the sensing TFT T3 area is illustrated as an example of an area in which the third top gate electrode TG3 is insulated from the repair line 210. However, depending on the case, when a TFT other than the sensing TFT T3 includes a top gate electrode and the top gate electrode overlaps the repair line 120, a color filter layer as an insulator may be formed between the top gate electrode and the repair line 120.

According to an embodiment, a repair line may be formed that is connected to a first electrode of a second pixel and extending to a source electrode of a first pixel. Thus, when it is determined that the first pixel is defective, the first pixel may be driven simultaneously with the second pixel by electrically connecting the repair line to the source electrode.

For example, according to an embodiment, a TFT having a double gate structure may be formed in an area overlapping a repair line, and an insulating layer may be formed between the repair line and a top gate electrode. Accordingly, a short circuit may be prevented from occurring between the repair line and the top gate electrode, and a response time of the TFT may be enhanced.

It will be apparent to those skilled in the art that various modifications and variations can be made in the present invention without departing from the spirit or scope of the inventions. Thus, it is intended that embodiments of the present invention cover the modifications and variations of this invention provided they come within the scope of the appended claims and their equivalents.

What is claimed is:

1. An organic light emitting display (OLED) device, comprising:
a first pixel comprising:
a first thin-film transistor (TFT) comprising a source electrode;
a second TFT; and
a third TFT comprising a top gate electrode;
a second pixel comprising an OLED comprising a first electrode;
a repair line extending over:
the first electrode of the OLED of the second pixel;
the source electrode of the first TFT of the first pixel; and
the top gate electrode of the third TFT of the first pixel;
a passivation layer between at least a portion of:
the source electrode of the first TFT of the first pixel; and
the repair line.

2. The device of claim 1, further comprising an insulating layer between at least a portion of the top gate electrode of the third TFT of the first pixel and the repair line.

3. The device of claim 2, wherein:
the insulating layer comprises a color filter layer; and
the color filter layer does not overlap the source electrode of the first TFT of the first pixel.

4. The device of claim 1, wherein, if the first pixel is defective, the repair line is directly physically connected to the source electrode of the first TFT of the first pixel through a hole irradiated by a laser beam through the passivation layer.

5. The device of claim 1, wherein, if the first pixel is not defective, the repair line is completely insulated from the source electrode of the first TFT of the first pixel by the insulating passivation layer.

6. The device of claim 1, wherein the repair line is integral with the first electrode of the OLED of the second pixel.

7. The device of claim 1, wherein:
the repair line comprises a same material as that of the first electrode of the OLED of the second pixel; and
the repair line is on a same layer as the first electrode of the OLED of the second pixel.

8. The device of claim 1, wherein the repair line comprises a different material from the first electrode of the OLED of the second pixel.

9. The device of claim 1, wherein the third TFT has a double gate structure.

10. A method of repairing an organic light emitting display (OLED) device comprising a first pixel comprising: a first thin-film transistor (TFT) comprising a source electrode, a second TFT, and a third TFT comprising a top gate electrode, a second pixel comprising an OLED comprising a first electrode, a repair line extending over: the first electrode of the OLED of the second pixel, the source electrode of the first TFT of the first pixel, and the top gate electrode of the third TFT of the first pixel, a passivation layer between at least a portion of: the source electrode of the first TFT of the first pixel, and the repair line, the method comprising:
if the first pixel is defective, forming a hole in the passivation layer, such that the repair line is directly physically connected to the source electrode of the first TFT of the first pixel through the hole, the passivation layer being between the repair line and the source electrode of the first TFT of the first pixel,
wherein the hole is formed by irradiating a laser beam through the passivation layer.

11. A method of manufacturing an organic light emitting display (OLED) device, the method comprising:
providing a first pixel comprising:
providing a first thin-film transistor (TFT) comprising a source electrode;
providing a second TFT; and
providing a third TFT comprising a top gate electrode;
providing a second pixel comprising:
an OLED comprising a first electrode; and
a color filter layer;
providing a repair line extending over:
the first electrode of the OLED of the second pixel;
the source electrode of the first TFT of the first pixel; and
the top gate electrode of the third TFT of the first pixel;
providing an insulating layer between at least a portion of the top gate electrode and the repair line.

12. The method of claim 11, wherein providing the insulating layer comprises providing the color filter layer.

13. The method of claim 12, wherein the color filter layer does not overlap the source electrode of the first TFT of the first pixel.

14. The method of claim 11, wherein, if the first pixel is defective, the repair line is directly physically connected to the source electrode of the first TFT of the first pixel through a hole irradiated by a laser beam through a passivation layer, the passivation layer being between the repair line and the source electrode of the first TFT of the first pixel.

15. The method of claim 11, wherein, if the first pixel is not defective, the repair line is completely insulated from the source electrode of the first TFT of the first pixel.

16. The method of claim 15, wherein the repair line is integral with the first electrode of the OLED of the second pixel.

17. The method of claim 15, wherein:
the repair line comprises a same material as that of the first electrode of the OLED of the second pixel;
the repair line is on a same layer as the first electrode of the OLED of the second pixel; and
the repair line is formed in a same process as the first electrode of the OLED of the second pixel.

18. The method of claim 15, wherein the repair line comprises a different material from the first electrode of the OLED of the second pixel.

19. The method of claim 15, wherein the third TFT has a double gate structure.

20. The method of claim 19, wherein a same sensing control signal is applied to a lower gate electrode and to the top gate electrode.

* * * * *